(12) United States Patent
Han et al.

(10) Patent No.: US 11,041,057 B2
(45) Date of Patent: *Jun. 22, 2021

(54) WINDOW FILM, MANUFACTURING METHOD THEREOF, AND DISPLAY DEVICE INCLUDING SAME

(71) Applicant: SAMSUNG SDI CO., LTD., Yongin-si (KR)

(72) Inventors: Ji Young Han, Suwon-si (KR); Si Kyun Park, Suwon-si (KR); Dong Myeong Shin, Suwon-si (KR); Nak Hyun Sung, Suwon-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/469,474

(22) PCT Filed: Nov. 3, 2017

(86) PCT No.: PCT/KR2017/012435
§ 371 (c)(1),
(2) Date: Jun. 13, 2019

(87) PCT Pub. No.: WO2018/110830
PCT Pub. Date: Jun. 21, 2018

(65) Prior Publication Data
US 2020/0108587 A1    Apr. 9, 2020

(30) Foreign Application Priority Data
Dec. 13, 2016   (KR) .......................... 10-2016-0169980

(51) Int. Cl.
*B32B 27/08*    (2006.01)
*C08J 7/043*    (2020.01)
(Continued)

(52) U.S. Cl.
CPC ................. *C08J 7/043* (2020.01); *B32B 7/12* (2013.01); *B32B 27/08* (2013.01); *B32B 27/281* (2013.01);
(Continued)

(58) Field of Classification Search
CPC ............ B32B 2255/10; B32B 2255/26; B32B 2457/20; B32B 27/08; B32B 27/281;
(Continued)

(56) References Cited

U.S. PATENT DOCUMENTS

2003/0176124 A1    9/2003    Koike et al.
2006/0057367 A1    3/2006    Sherman et al.
(Continued)

FOREIGN PATENT DOCUMENTS

CN    1462237 A    12/2003
CN    1708705 A    12/2005
(Continued)

OTHER PUBLICATIONS

Office action issued in Taiwanese Patent Application No. 105123994, dated May 12, 2017, 3 pages.
(Continued)

*Primary Examiner* — Lawrence D Ferguson
(74) *Attorney, Agent, or Firm* — Lewis Roca Rothgerber Christie LLP

(57) ABSTRACT

The present invention provides a window film, a manufacturing method thereof, and a display device including the same. The window film comprises: a basic material layer; a window coating layer formed on one surface of the basic material layer; and a back coating layer formed on the other surface of the basic material layer, wherein the window film has a relation of formula 1.

21 Claims, 3 Drawing Sheets

(51) Int. Cl.
| | |
|---|---|
| C09D 7/61 | (2018.01) |
| C09D 7/20 | (2018.01) |
| C09D 7/40 | (2018.01) |
| B32B 7/12 | (2006.01) |
| B32B 27/28 | (2006.01) |
| C08J 5/18 | (2006.01) |
| C08J 7/04 | (2020.01) |
| C09D 4/00 | (2006.01) |
| C09D 133/16 | (2006.01) |
| C09D 135/02 | (2006.01) |
| C09D 183/04 | (2006.01) |
| C08J 7/046 | (2020.01) |
| H01L 27/32 | (2006.01) |

(52) U.S. Cl.
CPC ............... *C08J 5/18* (2013.01); *C08J 7/042* (2013.01); *C08J 7/046* (2020.01); *C09D 4/00* (2013.01); *C09D 7/20* (2018.01); *C09D 7/61* (2018.01); *C09D 7/70* (2018.01); *C09D 133/16* (2013.01); *C09D 135/02* (2013.01); *C09D 183/04* (2013.01); *B32B 2255/10* (2013.01); *B32B 2255/26* (2013.01); *B32B 2457/20* (2013.01); *C08J 2379/08* (2013.01); *C08J 2433/16* (2013.01); *C08J 2435/02* (2013.01); *C08J 2483/04* (2013.01); *H01L 27/3244* (2013.01)

(58) Field of Classification Search
CPC ..... B32B 7/12; C08J 2379/08; C08J 2433/04; C08J 2433/16; C08J 2435/02; C08J 2483/04; C08J 2483/06; C08J 5/18; C08J 7/042; C08J 7/046; C08L 79/08; C09D 133/16; C09D 135/02; C09D 183/00; C09D 183/04; C09D 4/00; C09D 7/00; C09D 7/20; C09D 7/61; C09D 7/70; C09J 7/22; G02B 1/04; G02B 6/32; H01L 27/3244

See application file for complete search history.

(56) References Cited

U.S. PATENT DOCUMENTS

| | | |
|---|---|---|
| 2006/0108050 A1 | 5/2006 | Satake et al. |
| 2008/0097066 A1 | 4/2008 | Tsuchida et al. |
| 2008/0177000 A1 | 7/2008 | Ahn et al. |
| 2012/0107605 A1 | 5/2012 | Ozawa et al. |
| 2012/0243115 A1 | 9/2012 | Takamiya et al. |
| 2013/0177748 A1* | 7/2013 | Hirai ............ B32B 27/283 428/203 |
| 2014/0050909 A1 | 2/2014 | Choi et al. |
| 2014/0338959 A1 | 11/2014 | Jung et al. |
| 2015/0252212 A1 | 9/2015 | Kang et al. |
| 2016/0297178 A1 | 10/2016 | Kang et al. |

FOREIGN PATENT DOCUMENTS

| | | |
|---|---|---|
| CN | 1955765 A | 5/2007 |
| CN | 101019043 A | 8/2007 |
| CN | 103192558 A | 7/2013 |
| CN | 103903682 A | 7/2014 |
| CN | 104105598 A | 10/2014 |
| CN | 104115238 A | 10/2014 |
| CN | 105646881 A | 6/2016 |
| JP | 2007-127823 A | 5/2007 |
| JP | 2009-529436 | 8/2009 |
| JP | 2013-147535 A | 8/2013 |
| JP | 2015-508345 | 3/2015 |
| JP | 2016-164668 A | 9/2016 |
| KR | 10-2006-0111622 A | 10/2006 |
| KR | 10-2011-0087497 A | 8/2011 |
| KR | 10-2014-0024484 A | 2/2014 |
| KR | 10-2014-0085292 A | 7/2014 |
| KR | 10-2014-0104175 A | 8/2014 |
| KR | 10-2014-0111884 A | 9/2014 |
| TW | 201335313 A | 9/2013 |
| TW | 201500483 A | 1/2015 |
| WO | WO 2015/076567 A1 | 5/2015 |

OTHER PUBLICATIONS

Korean Office Action issued in Korean Application No. 10-2015-0109216, Korean Office Action dated Jan. 30, 2018 (6 pgs.).
U.S. Office Action dated Jun. 29, 2018, issued in U.S. Appl. No. 15/222,880 (29 pages).
Chinese Office action issued in Chinese Patent Application No. 201610617167.1, dated Jul. 26, 2018, 10 pages.
U.S. Final Office Action Dated Feb. 7, 2019, issued in U.S. Appl. No. 15/222,880 (28 pages).
U.S. Advisory Action dated May 3, 2019, issued in U.S. Appl. No. 15/222,880 (3 pages).
U.S. Office Action dated Jul. 1, 2019, issued in U.S. Appl. No. 15/222,880 (27 pages).
U.S. Notice of Allowance dated Feb. 18, 2020, issued in U.S. Appl. No. 15/222,880 (9 pages).
China Office Action in corresponding Chinese Patent Application No. 201780076606.5, Chinese Office Action dated Apr. 1, 2021 (8 pgs.).

* cited by examiner

【FIG. 1】
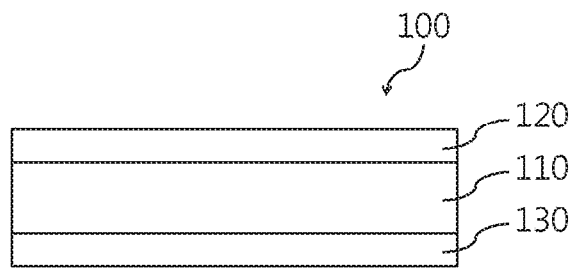
【FIG. 2】
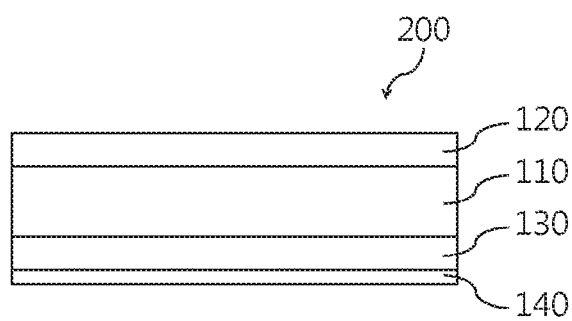
【FIG. 3】
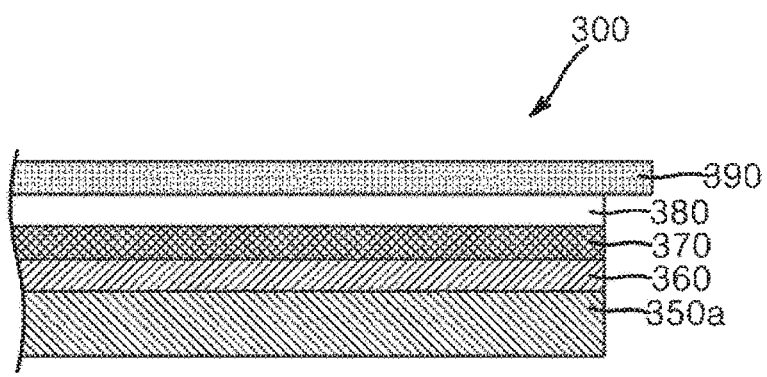

[FIG. 4]
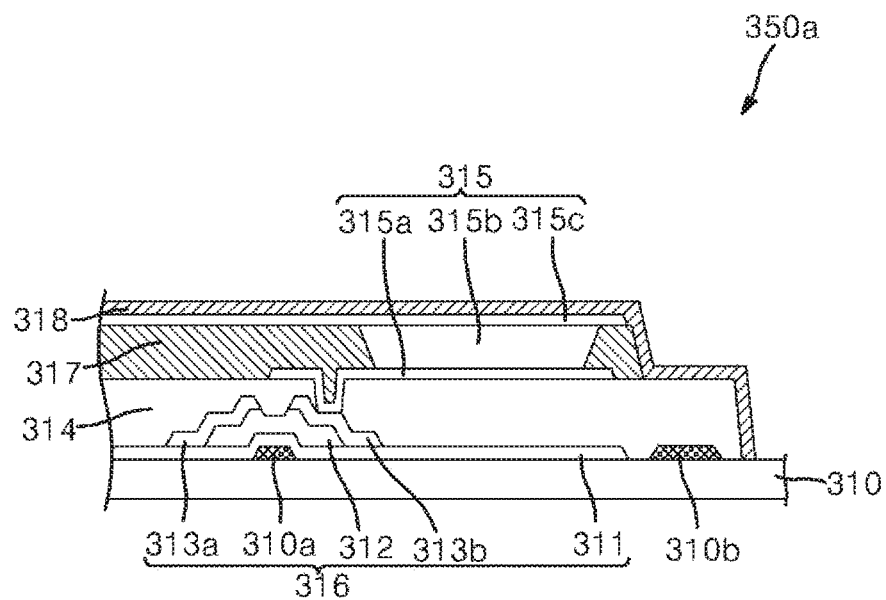
[FIG. 5]
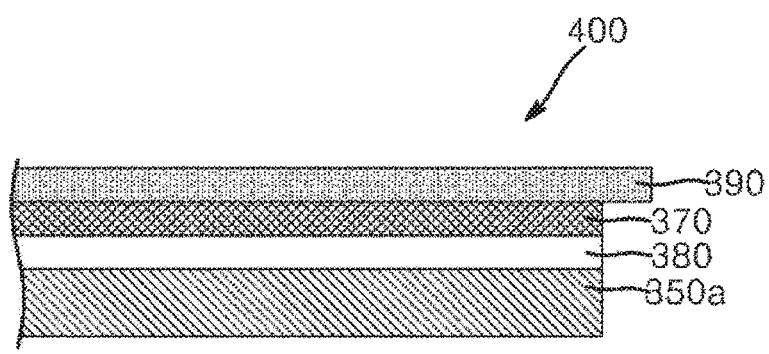

[FIG. 6]
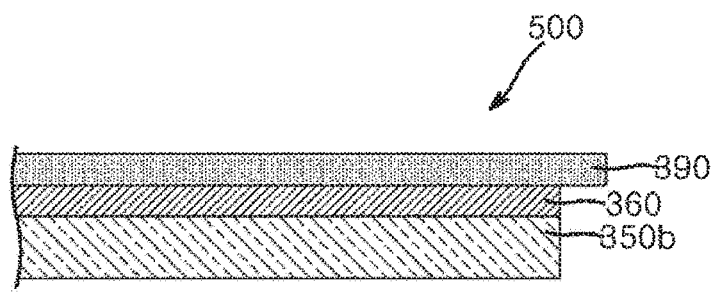

WINDOW FILM, MANUFACTURING METHOD THEREOF, AND DISPLAY DEVICE INCLUDING SAME

CROSS-REFERENCE TO RELATED APPLICATIONS

This application is a National Phase Patent Application and claims priority to and the benefit of International Application Number PCT/KR2017/012435, filed on Nov. 3, 2017, which claims priority to and the benefit of Korean Patent Application No. 10-2016-0169980, filed on Dec. 13, 2016, the entire contents of each of which are incorporated herein by reference.

FIELD

The present invention relates to a window film, a method of preparing the same, and a display including the same. More particularly, the present invention relates to a window film which has good optical properties such as total light transmittance, haze, and reflectance, has low yellowness, has high adhesion between a base layer and a back coating layer, which are included in the window film, and has high hardness and flexibility.

BACKGROUND

A window film is disposed at the outermost side of an optical display. The window film includes a base layer and a window coating layer formed on the base layer. Thus, the window film needs to have good transparency and pencil hardness. The window film includes a base layer and a coating layer formed of a curable resin. Depending on the base layer and/or the curable resin, the window film can have high yellowness and thus can appear yellow. In addition, long-term treatment at high temperature can cause high yellowness of the window film.

Recently, with replacement of a glass substrate or a high hardness substrate with a film in a display, flexible displays capable of being folded and unfolded have been developed. Thus, the window film also needs to have good flexibility. When the window film has a low radius of curvature in both directions thereof and thus has good flexibility, usefulness of the window film can be improved.

The background technique of the present invention is disclosed in Korean Patent Publication No. 2011-0087497.

SUMMARY

It is one aspect of the present invention to provide a window film which has high total light transmittance, low haze, and low reflectance.

It is another aspect of the present invention to provide a window film which has low yellowness and good appearance.

It is a further aspect of the present invention to provide a window film which has good adhesion between a base layer and a back coating layer.

It is yet another aspect of the present invention to provide a window film which has high hardness and high flexibility.

In accordance with one aspect of the present invention, there is provided a window film including: a base layer; a window coating layer formed on one surface of the base layer; and a back coating layer formed on the other surface of the base layer, wherein the window film satisfies Equation 1:

$$A^1 < A^2 < A^3 \quad \text{<Equation 1>}$$

(where $A^1$ is an index of refraction of the back coating layer, $A^2$ is an index of refraction of the window coating layer, and $A^3$ is an index of refraction of the base layer).

In accordance with another aspect of the present invention, there is provided a method of preparing a window film, the method including: forming a back coating layer on one surface of a base layer using a back coating layer composition; and forming a window coating layer on the other surface of the base layer using a window coating layer composition, wherein the back coating layer composition includes: inorganic hollow particles; at least one of a fluorine-containing monomer or an oligomer thereof; at least one of a fluorine-free monomer or an oligomer thereof; an initiator; a dye; and a solvent.

In accordance with a further aspect of the present invention, there is provided a display including the window film set forth above.

The present invention provides a window film which has high total light transmittance, low haze, and low reflectance.

The present invention provides a window film which has low yellowness and good appearance.

The present invention provides a window film which has good adhesion between a base layer and a back coating layer.

The present invention provides a window film which has high hardness and high flexibility.

BRIEF DESCRIPTION OF THE DRAWINGS

FIG. 1 is a sectional view of a window film according to one embodiment of the present invention.

FIG. 2 is a sectional view of a window film according to another embodiment of the present invention.

FIG. 3 is a sectional view of a flexible display according to one embodiment of the present invention.

FIG. 4 is a sectional view of one embodiment of a display part shown in FIG. 3.

FIG. 5 is a sectional view of a flexible display according to another embodiment of the present invention.

FIG. 6 is a sectional view of a flexible display according to a further embodiment of the present invention.

DETAILED DESCRIPTION

Embodiments of the present invention will be described in detail with reference to the accompanying drawings. It should be understood that the present invention may be embodied in different ways and is not limited to the following embodiments. In the drawings, portions irrelevant to the description will be omitted for clarity. Like components will be denoted by like reference numerals throughout the specification.

As used herein, spatially relative terms such as "upper" and "lower" are defined with reference to the accompanying drawings. Thus, it will be understood that the term "upper surface" can be used interchangeably with the term "lower surface". When an element or layer is referred to as being disposed "on" another element or layer, it can be directly disposed on the other element or layer or intervening elements or layers may be present. However, when an element or layer is referred to as being "directly disposed on" another element or layer, there are no intervening elements or layers present.

As used herein, "UV curable group" refers to: an epoxy group; a (meth)acrylate group; a (meth)acrylamide group; a vinyl group; an alicyclic epoxy group; a glycidoxy group; an oxetane group; or an epoxy group-, (meth)acrylate group-, (meth)acrylamide group-, vinyl group-, alicyclic epoxy group-, glycidoxy group- or oxetane group-containing $C_1$ to $C_6$ alkyl group or $C_5$ to $C_{10}$ cycloalkyl group. Here, the alicyclic epoxy group refers to an epoxidized $C_4$ to $C_{10}$ cycloalkyl group, "Ec" denotes a (3,4-epoxycyclohexyl) ethyl group, "Gp" denotes a 3-glycidoxypropyl group, "Op" denotes a 3-oxetanylpropyl group, "Me" denotes a methyl group, and "Et" denotes an ethyl group.

As used herein, the term "(meth)acrylic" refers to acrylic and/or methacrylic. In addition, unless otherwise stated, the term "substituted" means that at least one hydrogen atom in a functional group is substituted with a hydroxyl group, an unsubstituted $C_1$ to $C_{10}$ alkyl group, a $C_1$ to $C_{10}$ alkoxy group, a $C_3$ to $C_{10}$ cycloalkyl group, a $C_6$ to $C_{20}$ aryl group, a $C_7$ to $C_{20}$ arylalkyl group, a benzophenone group, a $C_6$ to $C_{20}$ aryl group substituted with a $C_1$ to $C_{10}$ alkyl group, or a $C_1$ to $C_{10}$ alkyl group substituted with a $C_1$ to $C_{10}$ alkoxy group. As used herein, "halogen" refers to fluorine, chlorine, bromine or iodine.

As used herein, "index of refraction" is a value measured using an ellipsometer (J. A. Woollam).

As used herein, "yellow index" is a value measured in accordance with ASTM D1925.

As used herein, "reflectance" is a value measured in accordance with ASTM E1164 and standard of JIS Z 8722.

Hereinafter, a window film according to one embodiment of the present invention will be described with reference to FIG. 1. FIG. 1 is a sectional view of a window film according to one embodiment of the present invention.

Referring to FIG. 1, a window film 100 according to this embodiment includes a base layer 110, a window coating layer 120, and a back coating layer 130, and may satisfy Equation 1:

$$A^1 < A^2 < A^3 \quad \text{<Equation 1>}$$

(where $A^1$ is an index of refraction of the back coating layer, $A^2$ is an index of refraction of the window coating layer, and $A^3$ is an index of refraction of the base layer).

When satisfying Equation 1, the window film 100 can have high total light transmittance, low haze, and low reflectance. Particularly, when the window film 100 includes the back coating layer 130 on a lower surface of the base layer 110 and the window coating layer 120 on an upper surface of the base layer 110 and satisfies Equation 1, the window film 100 can have high transmittance to internal light traveling through the back coating layer 130, the base layer 110, and the window coating layer 120. In addition, with the back coating layer 130 having a lower index of refraction than the base layer 110 and the window coating layer 120, the window film 100 can have low reflectance to external light.

Specifically, the window film may have a total light transmittance of 90% or more, specifically 91% or more, for example, 91% to 100%, as measured in the visible region (e.g., at a wavelength of 380 nm to 800 nm). In addition, the window film may have a haze of 2% or less, specifically 0.1% to 2%, as measured in the visible region (e.g., at a wavelength of 380 nm to 800 nm). Further, the window film has a reflectance of 8% or less, specifically 7% or less or 6.8% or less, for example, 0% to 7.1%. Within these ranges, the window film can improve display quality of a display when used in the display.

In one embodiment, the window film may include a polyimide film as the base layer. Generally, the polyimide film may have a yellow index of 3 or more, for example, 3 to 9. Despite including the polyimide film as the base layer, the window film may have a total light transmittance of 90% or more, for example, 90% to 99%, as measured in the visible region, a reflectance of 8% or less, specifically 7% or less or 6.8% or less, for example, 0% to 7.1%, and a yellow index of 2.3 or less, for example, 0 to 2.3. Within these ranges, the window film can improve display quality of a display when used in the display.

In another embodiment, the window film may include a polyimide film as the base layer and the window coating layer may include a silicone resin. Also in this case, the window film may have a total light transmittance of 90% or more, specifically 91% or more, for example, 91% to 100%, as measured in the visible region, a reflectance of 8% or less, specifically 7% or less or 6.8% or less, for example, 0% to 7.1%, and a yellowness of 2.3 or less, for example, 0 to 2.3. Within these ranges, the window film can improve image quality of a display when used in the display.

Base Layer

The base layer 110 can increase mechanical strength of the window film 100 by supporting the window film 100. Although the base layer 110 may be a non-flexible film, a flexible film may be used as the base layer 110 to improve flexibility of the window film 100.

In one embodiment, the base layer may have an index of refraction of 1.60 or more, for example, 1.60 to 1.75. Within this range, the window film can easily satisfy Equation 1 and can provide increase in transmittance and reduction in reflectance due to difference in index of refraction between the base layer and each of the window coating layer and the back coating layer.

In one embodiment, the base layer 110 may have a yellow index of 3 or more, for example, 3 to 9. When the window film 100 includes the base layer 110 having a yellow index of 3 or more and satisfies Equation 1, the window film 100 can have high total light transmittance and low reflectance.

The base layer 110 may be formed of an optically clear resin. Specifically, the optically clear resin may include at least one of a polyester resin such as polyethylene terephthalate, polyethylene naphthalate, polybutylene terephthalate, and polybutylene naphthalate, a polycarbonate resin, a poly(meth)acrylate resin such as poly(methyl methacrylate), a polystyrene resin, a polyamide resin, a polyimide resin, and a cyclic olefin polymer. Preferably, the base layer 110 is a film formed of a polyimide resin. Thus, the base layer 110 has high heat resistance and thus can increase heat resistance of the window film 100.

The base layer 110 may have a thickness of 10 μm to 150 μm, specifically 30 μm to 100 μm. Within this range, the base layer can be used in the window film.

In FIG. 1, the base layer is shown as formed in a single layer. However, it should be understood that the present invention is not limited thereto and the base layer may be formed in multiple layers. For example, the base layer may be a film stack in which a first base layer, an adhesive layer, and a second base layer are stacked in the stated order, wherein the first base layer and the second base layer may be bonded to one another via a clear adhesive, for example, an optically clear adhesive (OCA). The type of OCA is not particularly restricted. Each of the first base layer and the second base layer may be the base layer set forth above. The thickness and material of the first base layer may be the same as or different from those of the second base layer. The OCA may have a total light transmittance of 90% or more. Within this range, the OCA can bond the first base layer to the second base layer without affecting properties of the window film. For example, the OCA may be formed of an adhesive layer composition including: a monomer mixture for a hydroxyl group-containing (meth)acrylic copolymer; an initiator; and at least one of a macromonomer and organic nanoparticles. Here, the monomer mixture may be composed of a hydroxyl group-containing (meth)acrylate and an alkyl group-containing (meth) acrylate. The organic nanoparticles are core-shell type particles and may satisfy Equation 2:

$$Tg(c) < Tg(s) \qquad \text{<Equation 2>}$$

(where Tg(c) is a glass transition temperature (unit: °C.) of a core and Tg(s) is a glass transition temperature (unit: °C.) of a shell). The organic nanoparticles may have an average particle diameter of 10 nm to 400 nm, specifically 10 nm to 300 nm, more specifically 30 nm to 280 nm, still more specifically 50 nm to 280 nm. Within this range, the adhesive layer can have a total light transmittance of 90% or more, as measured in the visible region and thus can have good transparency without affecting folding of the window film. The core may have a glass transition temperature of −150° C. to 10° C., specifically −150° C. to −5° C., more specifically −150° C. to −20° C. Within this range, the adhesive layer can have viscoelasticity at low temperature and/or at room temperature. The core may include at least one of polyalkyl (meth)acrylate, polysiloxane, or polybutadiene. The shell may have a glass transition temperature of 15° C. to 150° C., specifically 35° C. to 150° C., more specifically 50° C. to 140° C. Within this range, the organic nanoparticles can have good dispersibility in the (meth)acrylic copolymer. The shell may include polyalkyl methacrylate.

Window Coating Layer

The window coating layer 120 is formed on one surface of the base layer 110 to secure optical properties of the window film 100, such as transmittance or haze, and to improve the pencil hardness and flexibility of the window film 100, thereby allowing the window film to be used in a flexible display as well as in a non-flexible display. The window coating layer 120 may be directly formed on the base layer 110. Herein, the expression "directly formed on" means that there is no intervening adhesive layer or the like between the window coating layer 120 and the base layer 110. The window coating layer 120 may be formed on a light exit surface of the base layer 110, with reference to internal light of a display.

The window coating layer 120 may have an index of refraction of less than 1.60, for example, 1.53 to 1.59. Within this range, the window film can easily satisfy Equation 1 and can have high transmittance and low reflectance due to difference in index of refraction between the window coating layer and the base layer.

The window coating layer 120 may have a thickness of 5 μm to 150 μm, specifically 5 μm to 100 μm, more specifically 5 μm to 80 μm or 5 μm to 50 μm. Within this range, the window film can have good flexibility.

The window coating layer 120 may be formed of a window coating layer composition including a silicone resin. Thus, the window coating layer composition can realize a window film having high pencil hardness and good flexibility. The window coating layer composition may include the silicone resin, a curable monomer, and an initiator. Now, the window coating layer composition will be described in detail.

The silicone resin forms a matrix of the window coating layer 120 and can increase the flexibility and pencil hardness of the window film 100. The silicone resin may include a UV curable group-containing siloxane resin. The UV curable group-containing siloxane resin may include a siloxane resin represented by Formula 1:

$$(R^1SiO_{3/2})_x(R^2SiO_{3/2})_y(R^3R^4SiO_{2/2})_z \qquad \text{<Formula 1>}$$

(where $R^1$ and $R^2$ are each independently a UV curable group and $R^1$ and $R^2$ are different from each other, $R^3$ and $R^4$ are each independently hydrogen, a UV curable group, an unsubstituted or substituted $C_1$ to $C_{20}$ alkyl group, or an unsubstituted or substituted $C_5$ to $C_{20}$ cycloalkyl group, and x, y and z are set to satisfy $0 < x \le 1$, $0 \le y < 1$, $0 \le z < 1$, and $x+y+z=1$).

$R^1$ and $R^2$ provide crosslinkability and may be each independently an alicyclic epoxy group-, glycidoxy group-, or oxetane group-containing $C_1$ to $C_6$ alkyl group or $C_5$ to $C_{10}$ cycloalkyl group, more specifically a (3,4-epoxycyclohexyl)methyl group, a (3,4-epoxycyclohexyl)ethyl group, a (3,4-epoxycyclohexyl)propyl group, a 3-glycidoxypropyl group, a 3-oxetanylmethyl group, a 3-oxetanylethyl group, or a 3-oxetanylpropyl group.

$R^3$ and $R^4$ further provide crosslinkability and flexibility to the window coating layer 120 and may be each independently an alicyclic epoxy group-, glycidoxy group-, or oxetane group-containing $C_1$ to $C_6$ alkyl group or $C_5$ to $C_{10}$ cycloalkyl group, or an unsubstituted or substituted $C_1$ to $C_{10}$ alkyl group, more specifically a (3,4-epoxycyclohexyl)methyl group, a (3,4-epoxycyclohexyl)ethyl group, a (3,4-epoxycyclohexyl)propyl group, a glycidoxypropyl group, a methyl group, or an ethyl group.

In one embodiment, the UV curable group-containing siloxane resin may be a siloxane resin represented by any one of Formulas 1-1 to 1-3:

$$R^1SiO_{3/2} \qquad \text{<Formula 1-1>}$$

$$(R^1SiO_{3/2})_x(R^2SiO_{3/2})_y \qquad \text{<Formula 1-2>}$$

$$(R^1SiO_{3/2})_x(R^3R^4SiO_{2/2})_z \qquad \text{<Formula 1-3>}$$

In Formulas 1-1 to 1-3, $R^1$, $R^2$, $R^3$, and $R^4$ are as defined in Formula 1, and x, y, and z are set to satisfy $0 < x < 1$, $0 < y < 1$, $0 < z < 1$, $x+y=1$, and $x+z=1$. Specifically, x, y, and z may be set to satisfy $0.20 \le x \le 0.999$, $0.001 \le y \le 0.80$, and $0.001 \le z \le 0.80$, more specifically $0.20 \le x \le 0.99$, $0.01 \le y \le 0.80$, and $0.01 \le z \le 0.80$, still more specifically $0.50 \le x \le 0.99$, $0.01 \le y \le 0.50$, and $0.01 \le z \le 0.50$, and still more specifically $0.90 \le x \le 0.97$, $0.03 \le y \le 0.10$, and $0.03 \le z \le 0.10$. Within this range, the window film can have good pencil hardness and flexibility. Specifically, the siloxane resin may include at least one of a siloxane resin composed of a T unit represented by $EcSiO_{3/2}$ and a siloxane resin composed of a T unit represented by $GpSiO_{3/2}$. In addition, the siloxane resin may be a siloxane resin including $(EcSiO_{3/2})_x(GpSiO_{3/2})_y$, $(0 < x < 1, 0 < y < 1, x+y=1)$. Further, the siloxane resin may include, without being limited to, any one of Formulas 1-3A to 1-3L:

$$(EcSiO_{3/2})_x(Me)_sSiO_{2/2})_z \qquad \text{<Formula 1-3A>}$$

$$(EcSiO_{3/2})_x(MeEtSiO_{2/2})_z \qquad \text{<Formula 1-3B>}$$

$$(GpSiO_{3/2})_x(Me)_2SiO_{2/2})_z \qquad \text{<Formula 1-3C>}$$

$$(GpSiO_{3/2})_x(MeEtSiO_{2/2})_z \qquad \text{<Formula 1-3D>}$$

$$(OpSiO_{3/2})_x(Me)_2SiO_{2/2})_z \qquad \text{<Formula 1-3E>}$$

$$(OpSiO_{3/2})_x(MeEtSiO_{2/2})_z \qquad \text{<Formula 1-3F>}$$

$$(EcSiO_{3/2})_x(EcMeSiO_{2/2})_z \qquad \text{<Formula 1-3G>}$$

(EcSiO$_{3/2}$)$_x$(GpMeSiO$_{2/2}$)$_z$   <Formula 1-3H>

(GpSiO$_{3/2}$)$_x$(EcMeSiO$_{2/2}$)$_z$   <Formula 1-3I>

(GpSiO$_{3/2}$)$_x$(GpMeSiO$_{2/2}$)$_z$   <Formula 1-3J>

(OpSiO$_{3/2}$)$_x$(EcMeSiO$_{2/2}$)$_z$   <Formula 1-3K>

(OpSiO$_{3/2}$)$_x$(GpMeSiO$_{2/2}$)$_z$   <Formula 1-3L>

(where x, y, and z are set to satisfy 0<x<1, 0<z<1, and x+z=1).

The UV curable group-containing siloxane resin may have a weight average molecular weight of 1,000 g/mol to 15,000 g/mol, for example, 4,000 g/mol to 8,000 g/mol. The UV curable group-containing siloxane resin may have a polydispersity index (PDI) of 1.0 to 3.0. When the weight average molecular weight and polydispersity index of the UV curable group-containing siloxane resin fall within these ranges, the window film can have high pencil hardness and transparency due to a tightly crosslinked network of the siloxane resin.

The UV curable group-containing siloxane resin represented by Formula 1 may be prepared by hydrolysis and condensation of alkoxysilane providing R$^1$SiO$_{3/2}$ alone or a monomer mixture including at least one of alkoxysilane providing R$^1$SiO$_{3/2}$, alkoxysilane providing R$^2$SiO$_{3/2}$, and alkoxysilane providing R$^3$R$^4$SiO$_{2/2}$. Hydrolysis and condensation are well known to those skilled in the art. Specifically, hydrolysis and condensation may be carried out at room temperature for 12 hours to 7 days or may be carried out at 60° C. to 100° C. for 2 hours to 72 hours to promote reaction, without being limited thereto. Although a solvent used in preparation of the UV curable group-containing siloxane resin is not particularly restricted, the solvent may include at least one of water, methanol, ethanol, n-propanol, isopropanol, n-butanol, tert-butanol, and methoxypropanol. In hydrolysis and condensation, a catalyst may be further used to control the rate of reaction. Examples of the catalyst may include: an acid catalyst such as hydrochloric acid, acetic acid, hydrogen fluoride, nitric acid, sulfuric acid, chlorosulfonic acid, or iodic acid; basic catalysts such as ammonia, potassium hydroxide, sodium hydroxide, barium hydroxide and imidazole; and ion exchange resins such as Amberite IRA-400 or IRA-67.

In addition, the UV curable group-containing siloxane resin may include, but is not limited to, a siloxane resin prepared by hydrolysis and condensation of a compound represented by Formula 2 alone or a mixture of a compound represented by Formula 2 and a compound represented by Formula 3:

R$^5$-R$^8$—Si(OR$^6$)$_m$(R$^7$)$_{3-m}$   <Formula 2>

(where R$^5$ is a UV curable group, R$^6$ is a C$_1$ to C$_{10}$ alkyl group, R$^7$ is a C$_1$ to C$_{10}$ alkyl group, a C$_3$ to C$_{20}$ cycloalkyl group, a C$_6$ to C$_{20}$ aryl group, or a C$_7$ to C$_{20}$ arylalkyl group, R$^8$ is a single bond or a C$_1$ to C$_{10}$ alkylene group, and m is an integer of 1 to 3),

Si(OR$^9$)$_n$(R$^{10}$)$_{1-n}$   <Formula 3>

(where R$^9$ is a C$_1$ to C$_{10}$ alkyl group, R$^{10}$ is an unsubstituted C$_1$ to C$_{20}$ alkyl group, a C$_3$ to C$_8$ cycloalkyl group, a C$_3$ to C$_{20}$ alkenyl group, a C$_2$ to C$_{20}$ alkynyl group, a C$_6$ to C$_{20}$ aryl group, halogen, a halogen-containing C$_1$ to C$_{10}$ alkyl group, an amino group, an amino group-containing C$_1$ to C$_{10}$ alkyl group, a mercapto group, a C$_1$ to C$_{10}$ ether group, a carbonyl group, a carboxylic acid group, or a nitro group, and n is an integer of 1 to 4).

In Formula 2, the term "single bond" means that R$^5$ is directly linked to Si without R$^8$. Specifically, the compound represented by Formula 2 may be at least one of 2-(3,4-epoxycyclohexyl)ethyltrimethoxysilane, 2-(3,4-epoxycyclohexyl)ethyltriethoxysilane, (meth)acryloxypropyltrimethoxysilane, (meth)acryloyloxypropyltriethoxysilane, and vinyltrimethoxysilane, without being limited thereto.

Specifically, the compound represented by Formula 3 may include at least one of tetramethoxysilane, tetraethoxysilane, methyltrimethoxysilane, methyltriethoxysilane, methyltripropoxysilane, dimethyldimethoxysilane, dimethyldiethoxysilane, phenyltrimethoxysilane, diphenyldimethoxysilane, diphenyldiethoxysilane, triphenylmethoxysilane, triphenylethoxysilane, ethyltriethoxysilane, propylethyltrimethoxysilane, 3-aminopropyltrimethoxysilane, 3-aminopropyltriethoxysilane, chloropropyltrimethoxysilane, and chloropropyltriethoxysilane.

The curable monomer increases pencil hardness of the window film through crosslinking with the silicone resin and provides good processability by controlling viscosity of the window coating layer composition. The curable monomer may include at least one of an epoxy group-containing monomer, an acid anhydride group-containing monomer, and an oxetane group-containing monomer. The epoxy group-containing monomer may include a photocurable monomer containing at least one epoxy group. Here, the epoxy group may include an epoxy group and an epoxy group-containing organic group, for example, a glycidyl group. The epoxy group-containing monomer may include an alicyclic epoxy monomer, an aromatic epoxy monomer, an aliphatic epoxy monomer, a hydrogenated epoxy monomer, or a mixture thereof. The alicyclic epoxy monomer is a monomer having at least one epoxy group in a C$_3$ to C$_{10}$ alicyclic ring, and may be, for example, 3,4-epoxycyclohexylmethyl-3',4'-epoxycyclohexanecarboxylate, without being limited thereto. The aromatic epoxy monomer may be bisphenol A, bisphenol F, phenol novolac, cresol novolac, glycidyl ether of triphenylmethane, tetraglycidyl methylenedianiline, or the like. The aliphatic epoxy monomer may be 1,4-butanediol diglycidyl ether, 1,6-hexanediol diglycidyl ether, or the like. The hydrogenated epoxy monomer is obtained by hydrogenating an aromatic epoxy monomer and may be hydrogenated bisphenol A diglycidyl ether or the like. The acid anhydride group-containing monomer may include at least one of phthalic anhydride, tetrahydrophthalic anhydride, hexahydrophthalic anhydride, nadic methyl anhydride, chlorendic anhydride, and pyromellitic anhydride. The oxetane group-containing monomer may include at least one of 3-methyloxetane, 2-methyloxetane, 3-oxetanol, 2-methyleneoxetane, 3,3-oxetanedimethanethiol, 4-(3-methyloxetan-3-yl)benzonitrile, N-(2,2-dimethylpropyl)-3-methyl-3-oxetane methaneamine, N-(1,2-dimethylbutyl)-3-methyl-3-oxetane methaneamine, (3-ethyloxetan-3-yl) methyl (meth)acrylate, 3-ethyl-3-hydroxymethyloxetane, 2-ethyloxetane, xylene bi s-oxetane, and 3-ethyl-3-[[(3-ethyloxetane-3-yl]methoxy]methyl]oxetane.

The initiator serves to cure the silicone resin and the curable monomer to form the window coating layer. The initiator may include at least one of a photocationic initiator, a cationic thermal polymerization initiator, and a photoradical initiator.

The photocationic initiator generates cations upon light irradiation to promote curing, and may include any suitable photocationic initiator known in the art. Specifically, the photocationic initiator may include a salt of a cation and a salt of an anion. Examples of the cation may include: diaryliodoniums such as diphenyliodonium, 4-methoxydiphenyliodonium, bis(4-methylphenyl)iodonium, (4-methylphenyl)[(4-(2-methylpropyl)phenyl)iodonium], bis(4-tert-butylphenyl)iodonium, bis(dodecylphenyl)iodonium, and bis(dodecylphenyl)iodonium; triarylsulfoniums such as triphenylsulfonium, diphenyl-4-thiophenylphenylsulfonium; bis[4-(diphenyl sulfonio)phenyl]sulfide; bis[4-(di(4-(2-hydroxyethyl)phenyl)sulfonio)-phenyl]sulfide; and (η5-2,4-cyclopentadien-1-yl)[(1,2,3,4,5,6-q)-(1-methylethyl)benzene]iron (1$^+$). Examples of the anion may include tetrafluoroborate ($BF_4^-$), hexafluorophosphate ($PF_6^-$), hexafluoroantimonate ($SbF_6^-$), hexafluoroarsenate ($AsF_6^-$), and hexachloroantimonate ($SbCl_6^-$). Examples of the cationic thermal polymerization initiator may include 3-methyl-2-butenyltetramethylenesulfonium, ytterbium, samarium, erbium, dysprosium, lanthanum, tetrabutylphosphonium, ethyltriphenylphosphonium bromide salt, benzyl dimethyl amine, dimethyl aminomethyl phenol, triethanol amine, N-n-butyl imidazole, and 2-ethyl-4-methylimidazole. Examples of the anion may include tetrafluoroborate ($BF_4^-$), hexafluorophosphate ($PF_6^-$), hexafluoroantimonate ($SbF_6^-$), hexafluoroarsenate ($AsF_6^-$), and hexachloroantimonate ($SbCl_6^-$). The photoradical initiator generates radicals upon light irradiation to promote curing, and may include any suitable photoradical initiator known in the art. Specifically, the photoradical initiator may include at least one of phosphorus, triazine, acetophenone, benzophenone, thioxanthone, benzoin, oxime, and phenylketone photoradical initiators.

The window coating layer composition may have a viscosity of 1 cP to 3,000 cP, as measured at 25° C. Within this range, the window coating layer composition can have good coatability and applicability and thus can be easily formed into the window coating layer.

The window coating layer composition may include 65 wt % to 95 wt % of the silicone resin, 4 wt % to 30 wt % of the curable monomer, and 0.1 wt % to 10 wt % of the initiator in terms of solid content. Within this range, the window coating layer can have high flexibility and high pencil hardness. As used herein, the term "solid content" refers to the content of all solid matter excluding a solvent.

The window coating layer composition may include 100 parts by weight of the silicone resin, 1 part by weight to 20 parts by weight, specifically 1 part by weight to 15 parts by weight, more specifically 10 parts by weight to 15 parts by weight of the curable monomer, and 0.1 parts by weight to 20 parts by weight, specifically 0.5 parts by weight to 10 parts by weight of the initiator, in terms of solid content. Within this range, the window coating layer can have high flexibility and high pencil hardness.

The window coating layer composition may further include any typical additive known in the art. The additive may include at least one of an antistatic agent, a leveling agent, an antioxidant, a stabilizer, and a colorant.

The window coating layer composition may further include a solvent such as methyl ethyl ketone.

The window coating layer composition may further include nanoparticles. The nanoparticles can further improve pencil hardness of the window film. The nanoparticles may include at least one of silica, aluminum oxide, zirconium oxide, and titanium oxide, without being limited thereto. The nanoparticles may be subjected to surface treatment with a silicone compound and are not limited to a particular shape or size. Specifically, the nanoparticles may have a spherical, flake, or amorphous particle shape. The nanoparticles may have an average particle size (D50) of 1 nm to 200 nm, specifically 5 nm to 50 nm, more specifically 10 nm to 30 nm. Within this range, the nanoparticles can increase pencil hardness of the window film without affecting surface roughness and transparency of the window coating layer. The nanoparticles may be present in an amount of 0.1 parts by weight to 100 parts by weight, specifically about 1 part by weight to 80 parts by weight, relative to 100 parts by weight of the siloxane resin in terms of solid content. Within this range, the nanoparticles can increase pencil hardness of the window film while reducing surface roughness of the window coating layer.

Back Coating Layer

The back coating layer 130 is formed on the other surface of the base layer 110 to support the window film 100. In FIG. 1, the back coating layer 110 is shown as directly formed on the base layer 110. Herein, the expression "directly formed on" means that there is no intervening adhesive layer between the back coating layer 130 and the base layer 110. The back coating layer 130 may be formed on a light entry surface of the base layer 110, with reference to internal light of a display.

The back coating layer 130 may have an index of refraction of 1.54 or less, for example, 1.39 to 1.54, or 1.39 to 1.52. Within this range, the window film can easily satisfy Equation 1 and can have high transmittance and low reflectance due to the difference in index of refraction between the coating layer and the base layer.

The back coating layer 130 may include inorganic hollow particles, at least one of a fluorine-containing monomer or an oligomer thereof, and a dye. Preferably, the back coating layer includes: inorganic hollow particles; at least one of a fluorine-containing monomer or an oligomer thereof; and a dye. Thus, the back coating layer has a lower index of refraction than the base layer and the window coating layer and can reduce yellowness of the window film.

The back coating layer may include a total of 9 wt % to 80 wt % of the inorganic hollow particles and the fluorine-containing monomer or the oligomer thereof. Within this range, the window film can have high transmittance and low reflectance due to difference in index of refraction between the coating layer and the base layer. The back coating layer may include 9 wt % to 80 wt %, for example, 9 wt % to 78 wt % of the fluorine-containing monomer or the oligomer thereof. Within this range, the window film can have high transmittance, low reflectance, and low yellowness due to the difference in index of refraction between the coating layer and the base layer.

In one embodiment, the back coating layer may be formed of a back coating layer composition including: inorganic hollow particles; at least one of a fluorine-containing monomer or an oligomer thereof; a fluorine-free monomer or an oligomer thereof; an initiator; and a dye.

The inorganic hollow particles may have an index of refraction of 1.4 or less, specifically 1.33 to 1.38. The inorganic hollow particles may have an average particle diameter (D50) of 30 nm to 100 nm, specifically 40 nm to 70 nm. Within this range, the inorganic hollow particles can be contained in the back coating layer and can be advantageously applied to the window film. The inorganic hollow particles may include silica, mullite, alumina, silicon carbide (SiC), $MgO—Al_2O_3—SiO_2$, $Al_2O_3—SiO_2$, $MgO—Al_2O_3—SiO_2—LiO_2$, or a mixture thereof, all of which may be subjected to surface treatment. Preferably, the inorganic hollow particles may include hollow silica.

The fluorine-containing monomer or the oligomer thereof may include a fluorine-containing (meth)acrylic monomer or an oligomer thereof.

The inorganic hollow particles and the fluorine-containing monomer or the oligomer thereof may be contained in their own form, or may be contained in the form of a solution containing all of these components. The solution may further include an initiator, a (meth)acrylic monomer, and a solvent, for example, methyl isobutyl ketone. The entirety of the inorganic hollow particles and the fluorine-containing monomer or the oligomer thereof, or the solution containing the entirety of the inorganic hollow particles and the fluorine-containing monomer or the oligomer thereof may have an index of refraction of 1.42 or less, specifically 1.33 to 1.38. Within this range, the index of refraction of the back coating layer can be reduced. The solution may include any suitable commercially available product, for example, XJA-0247 (Pelnox Corporation), without being limited thereto.

The inorganic hollow particles and the fluorine-containing monomer or the oligomer thereof may be present in total in an amount of 9 wt % to 80 wt %, specifically 9 wt % to 78 wt % in the back coating layer composition in terms of solid content. Within this range, the window film can have high transmittance, low reflectance, and low yellowness due to difference in index of refraction between the coating layer and the base layer.

Preferably, the fluorine-free monomer or the oligomer thereof is a UV curable group-containing, for example, a (meth)acrylate group- or epoxy group-containing compound. The fluorine-free monomer or the oligomer thereof may include at least one of a polyfunctional (meth)acrylate monomer or an oligomer thereof. The fluorine-free monomer or the oligomer thereof may be a bi- to deca-functional (meth)acrylate compound.

The fluorine-free monomer or the oligomer thereof may include at least one of a polyfunctional (meth)acrylate such as an ester of polyhydric alcohol and (meth) acrylic acid or a polyfunctional urethane (meth)acrylate prepared from polyhydric alcohol, an isocyanate compound, and hydroxy ester of (meth)acrylic acid. Preferably, the fluorine-free monomer or the oligomer thereof includes bi- or higher functional (meth)acrylic monomers, more preferably tri- to hexa-functional (meth)acrylic monomers. These may be used alone or as a mixture thereof.

The fluorine-free (meth)acrylate oligomer may include a bi- or higher functional (meth)acrylate oligomer, specifically bi- to hexa-functional (meth)acrylate oligomer.

Preferably, the fluorine-free (meth)acrylate oligomer may include a urethane (meth)acrylate oligomer. The urethane (meth)acrylic oligomer may be a urethane (meth)acrylic oligomer prepared by urethanizing at least one polyol, at least one polyisocyanate compound, and at least one (meth)acrylate containing a hydroxyl group by any typical method known in the art. Here, the polyol may include at least one of an aromatic polyether polyol, an aliphatic polyether polyol, an alicyclic polyether polyol, a polyester polyol, a polycarbonate polyol, and a polycaprolactone polyol. The polyisocyanate compound is a compound having at least two isocyanate groups, and examples thereof may include tolylene diisocyanate, xylene diisocyanate, naphthalene diisocyanate, phenylene diisocyanate, diphenylmethane diisocyanate, biphenylene diisocyanate, hexane diisocyanate, isophorone diisocyanate, or adducts thereof. The hydroxyl group-containing (meth)acrylate is a $C_1$ to $C_{10}$ (meth)acrylic acid ester having at least one hydroxyl group, and examples thereof may include 2-hydroxyethyl (meth)acrylate and 1,4-butanediol (meth)acrylate. Specifically, the urethane (meth)acrylic oligomer may include a hexa-functional aliphatic urethane (meth)acrylate oligomer. The fluorine-free (meth)acrylate oligomer may have a weight average molecular weight of 500 g/mol to 8,000 g/mol, specifically 1,000 g/mol to 5,000 g/mol. Within this range, the window film can have high pencil hardness and good flexibility.

The fluorine-free monomer may be a bi- or higher functional (meth)acrylate.

Examples of the bifunctional (meth)acrylate may include ethylene glycol di(meth)acrylate, diethylene glycol di(meth)acrylate, butanediol di(meth)acrylate, hexanediol di(meth)acrylate, nonanediol di(meth)acrylate, ethoxylated hexanediol di(meth)acrylate, propoxylated hexanediol di(meth)acrylate, diethyleneglycol di(meth)acrylate, polyethylene glycol di(meth)acrylate, tripropyleneglycol di(meth)acrylate, polypropyleneglycol di(meth)acrylate, neopentylglycol di(meth)acrylate, ethoxylated neopentyl glycol di(meth)acrylate, and tripropylene glycol di(meth)acrylate.

Examples of the tri- or higher functional (meth)acrylate may include: tri-functional (meth)acrylates such as trimethylolpropane tri(meth)acrylate, tris-2-hydroxyethyl isocyanurate tri(meth)acrylate, glycerine tri(meth)acrylate, pentaerythritol tri(meth)acrylate, dipentaerythritol tri(meth)acrylate, and ditrimethylolpropane tri(meth)acrylate; alkoxy-modified trifunctional (meth) acrylates such as ethoxylated trimethylolpropane tri(meth)acrylate, propoxylated trimethylolpropane tri(meth)acrylate, propoxylated trimethylolpropane tri(meth)acrylate, propoxylated glyceryl tri(meth)acrylate; tetra-functional (meth)acrylates such as pentaerythritol tetra(meth)acrylate, ditrimethylolpropane tetra(meth)acrylate, and dipentaerythritol tetra(meth)acrylate; penta-functional (meth)acrylates such as dipentaerythritol penta(meth)acrylate and ditrimethylol propane penta(meth)acrylate; and hexa-functional (meth)acrylates such as dipentaerythritol hexa(meth)acrylate and ditrimethylol propane hexa(meth)acrylate.

The fluorine-free monomer or the oligomer thereof may be present in an amount of 15 wt % to 88 wt %, specifically 19 wt % to 87 wt % in the back coating layer composition in terms of solid content. Within this range, the window film can have high transmittance, low reflectance, and low yellowness due to difference in index of refraction between the coating layer and the base layer.

The initiator is a photopolymerization initiator that may have an absorption wavelength of 150 nm to 500 nm, and may include at least one of an α-hydroxy ketone initiator or an α-amino ketone initiator, for example, 1-hydroxycyclohexyl phenyl ketone or a mixture including the same.

The initiator may be present in an amount of 1 wt % to 5 wt %, specifically 1 wt % to 3 wt % in the back coating layer composition in terms of solid content. Within this range, solid matter in the back coating layer composition can be completely cured and deterioration in optical properties of the window film due to residue of the initiator can be prevented.

The dye serves to prevent the window film from appearing yellow by reducing yellowness of the window film without deterioration in optical properties of the base layer, the window coating layer, and the window film. The dye may have a maximum absorption wavelength of 500 nm to 650 nm, specifically 550 nm to 620 nm. Within this range, the dye can reduce yellowness of the window film without deterioration in optical properties of the base layer, the window coating layer, and the window film. As used herein, the term "maximum absorption wavelength" refers to a wavelength corresponding to the maximum absorption peak, that is, a wavelength corresponding to the maximum absorbance on a wavelength-dependent absorbance curve. For example, the dye may include at least one of a metal dye and a non-metal dye, all of which have a maximum absorption wavelength of 500 nm to 650 nm. The metal dye may include a dye that has a maximum absorption wavelength of 500 nm to 650 nm, specifically 550 nm to 620 nm and contains a metal. Specifically, the metal dye may include at least one metal complex such as a vanadium, chromium, and manganese complex, without being limited thereto. For example, the metal dye may be a conjugated heterocyclic vanadium complex. The non-metal dye may include a dye that is free from metal and has a maximum absorption wavelength of 500 nm to 650 nm, specifically 550 nm to 620 nm. Specifically, the non-metal dye may include at least one of cyanine, porphyrin such as tetraazaporphyrin, arylmethane, squarylium, azomethine, oxonol, azo, arylidene, xanthene, and merocyanine dyes, without being limited thereto. For example, the dye may include at least one of KCF Blue b (Kyung-In Synthetic, maximum absorption wavelength: 596 nm, a tetraazaporphyrin dye), SK-D584 (SK Chemicals, maximum absorption wavelength: 584 nm, a tetraazaporphyrin dye), PD-311S (Yamamoto Chemicals, maximum absorption wavelength: 584 nm, a porphyrin dye), SK-D593 (SK Chemicals, maximum absorption wavelength: 593 nm, a vanadium dye), and PANAX NEC 595 (Ukseung Chemicals, maximum absorption wavelength: 595 nm, a mixture of a tetraazaporphyrin dye and a vanadium dye).

The dye may be present in an amount of 0.001 wt % to 15 wt %, specifically 0.01 wt % to 5 wt %, more specifically 0.1 wt % to 3 wt % in the back coating layer composition in terms of solid content. Within this range, the dye can prevent the window film from appearing yellow while preventing reduction in transparency of the window film.

The back coating layer composition may further include at least one of organic nanoparticles and simple inorganic particles. In the back coating layer composition, the at least one of organic nanoparticles and simple inorganic particles may be present in an amount of 0.1 parts by weight to 100 parts by weight, specifically 1 part by weight to 80 parts by weight, relative to 100 parts by weight of the UV curable group-containing resin in terms of solid content. Within this range, the back coating layer composition can have reduced surface roughness and the window film can have increased pencil hardness. As used herein, the term "simple particles" refers to non-hollow particles.

The back coating layer composition may further include any typical additive known in the art. The additive may include at least one of a UV absorbent, a reaction inhibitor, an adhesion promoter, a thixotropic agent, a conductivity imparting agent, a color adjusting agent, a stabilizer, an antistatic agent, an antioxidant, and a leveling agent.

The back coating layer composition may include a solvent. Examples of the solvent may include isopropyl alcohol, ethylene glycol dimethyl ether, ethanol, and acetone. Preferably, the solvent includes a mixture of isopropyl alcohol and ethylene glycol dimethyl ether. When the mixture of isopropyl alcohol and ethylene glycol dimethyl ether is used as the solvent, adhesion of the base layer to the back coating layer can be improved, yellowness of the window film can be further reduced, and the inorganic hollow particles can be better dispersed in the back coating layer composition, thereby reducing the index of refraction of the back coating layer.

The back coating layer 130 may have a thickness of 5 μm or less, specifically 300 nm or less, for example, 60 nm to 300 nm, 100 nm to 300 nm, or 150 nm to 300 nm. Within this range, the back coating layer can be used in the window film and can exhibit good flexibility.

The window film may have a pencil hardness of 3H or more, specifically 3H to 8H. Within this range, the window film can be used in an optical display. The window film may have a radius of curvature in the compressive direction of 10.0 mm or less, specifically 0.1 mm to 5.0 mm and a radius of curvature in the tensile direction of 20.0 mm or less, specifically 0.1 mm to 10.0 mm. Within these ranges, the window film can have good flexibility and thus can be used as a flexible window film. The window film can have good flexibility on both sides thereof due to low radius of curvature in both the compressive and tensile directions and thus can exhibit good usability.

The window film may have a thickness of 50 μm to 300 μm. Within this range, the window film can be used in an optical display.

Next, a window film according to another embodiment of the present invention will be described.

A window film according to this embodiment is substantially the same as the window film according to the above embodiment except that the back coating layer is formed of a back coating layer composition which includes inorganic hollow particles, a fluorine-containing monomer or an oligomer thereof, a fluorine-free monomer or an oligomer thereof, an initiator, and a solvent, wherein the solvent includes isopropyl alcohol and ethylene glycol dimethyl ether in a weight ratio (unit: parts by weight) set forth below.

The back coating layer may be formed of a back coating layer composition including a blended solvent of isopropyl alcohol (IPA) and ethylene glycol dimethyl ether (EGDE). In one embodiment, the base layer may be a polyimide film. The blended solvent slightly dissolves a surface of the polyimide film to form a buffer layer, thereby increasing adhesion of the back coating layer to the base layer, further reducing yellowness, improving appearance, increasing total light transmittance, reducing reflectance, and considerably reducing yellowness. In addition, the blended solvent improves dispersion of the inorganic hollow particles in the back coating layer composition, thereby reducing the index of refraction of the back coating layer. The blended solvent includes IPA and EGDE in a weight ratio of 80:20 to 50:50 (IPA:EGDE) based on a total 100 parts by weight of IPA and EGDE. Within this range, the blended solvent can increase adhesion of the back coating layer to the base layer, improve appearance, increase total light transmittance, reduce reflectance, and significantly reduce yellowness. If the weight ratio of IPA to EGDE is outside this range or the composition includes a solvent other than the blend of IPA and EGDE, such as IPA alone, ethanol, acetone, acetonitrile, or methyl isobutyl ketone, adhesion of the back coating layer to the base layer can be reduced, reflectance of the window film can be high, rainbow stains can be generated in the coating layer, causing increase in yellowness, dispersion of the inorganic hollow particles can become poor, causing generation of pinholes, or the index of refraction and yellowness of the window film can be high.

Next, a window film according to a further embodiment of the present invention will be described with reference to FIG. 2. FIG. 2 is a sectional view of a window film according to a further embodiment of the present invention.

Referring to FIG. 2, a window film 200 according to this embodiment is substantially the same as the window film 100 according to the above embodiment of the present invention except that an adhesive layer 140 is further formed on a lower surface of the back coating layer 130. Thus, the adhesive layer 140 will mainly be described below.

The adhesive layer 140 is formed on the lower surface of the back coating layer 130, such that the window film 200 can be directly bonded to a device of a display, such as a polarizing plate, a conductive film, and an organic light emitting diode. The adhesive layer 140 may have a thickness of 10 μm to 100 μm, specifically 20 μm to 80 μm, more specifically 30 μm to 50 μm.

In one embodiment, the adhesive layer 140 may be formed of an adhesive layer composition including a (meth) acrylic adhesive resin and a curing agent. The (meth)acrylic adhesive resin may include a (meth)acrylic copolymer of a monomer mixture including at least one of an alkyl group-containing (meth)acrylic monomer, a hydroxyl group-containing (meth)acrylic monomer, an alicyclic group-containing (meth)acrylic monomer, a hetero-alicyclic group-containing (meth)acrylic monomer, and a carboxylic acid group-containing (meth)acrylic monomer.

The alkyl group-containing (meth)acrylic monomer may include an unsubstituted $C_1$ to $C_{10}$ alkyl group-containing (meth)acrylic acid ester. The hydroxyl group-containing (meth)acrylic monomer may include a $C_1$ to $C_{10}$ alkyl group-containing (meth)acrylic acid ester having at least one hydroxyl group. The alicyclic group-containing (meth) acrylic monomer may include a $C_3$ to $C_{10}$ alicyclic group-containing (meth)acrylic acid ester. The hetero-alicyclic group-containing (meth)acrylic monomer may include a $C_3$ to $C_{10}$ hetero-alicyclic group-containing (meth)acrylic monomer having at least one of nitrogen, oxygen, and sulfur. The carboxylic acid group-containing (meth)acrylic monomer may include a (meth)acrylic acid and the like. The curing agent may include at least one of an isocyanate curing agent, an epoxy curing agent, an imide curing agent, and a metal chelate curing agent. These may be used alone or as a mixture thereof. The curing agent may be present in the adhesive layer composition in an amount of 0.1 parts by weight to 10 parts by weight, specifically 0.1 parts by weight to 1 part by weight, relative to 100 parts by weight of the (meth)acrylic adhesive resin in terms of solid content. The adhesive layer composition may further include a silane coupling agent. The silane coupling agent can further improve adhesion of the adhesive layer composition. The silane coupling agent may include at least one typical silane coupling agent. Specifically, the silane coupling agent may include at least one of a silane compound having an epoxy structure such as 3-glycidoxypropyltrimethoxysilane, 3-glycidoxypropylmethyldimethoxysilane, and 2-(3,4-epoxycyclohexyl)ethyltrimethoxysilane; a polymerizable unsaturated group-containing silane compound such as vinyltrimethoxysilane, vinyltriethoxysilane, and (meth) acryloxypropyltrimethoxysilane; and an amino group-containing silane compound such as 3-aminopropyltrimethoxysilane, 3-aminopropyltriethoxysilane, N-(2-aminoethyl)-3-aminopropyltrimethoxysilane, and N-(2-aminoethyl)-3-aminopropylmethyldimethoxysilane. In the adhesive layer composition, the silane coupling agent may be present in an amount of 0 parts by weight to 10 parts by weight, specifically 0 parts by weight to 1 part by weight, relative to 100 parts by weight of the (meth)acrylic adhesive resin in terms of solid content. Within this range, the adhesive layer composition can have good adhesion.

In another embodiment, the adhesive layer 140 may be formed of the OCA set forth above.

Next, a method of preparing window films according to the present invention will be described. The method of preparing window films according to the present invention includes forming a back coating layer on one surface of a base layer using a back coating layer composition and forming a window coating layer on the other surface of the base layer using a window coating layer composition, wherein the back coating layer may include inorganic hollow particles, a fluorine-containing monomer or an oligomer thereof, a fluorine-free monomer or an oligomer thereof, an initiator, a dye, and a solvent. Preferably, the solvent includes isopropyl alcohol (IPA) and ethylene glycol dimethyl ether (EGDE) in a weight ratio of 80:20 to 50:50 (IPA:EGDE) based on a total 100 parts by weight of IPA and EGDE. The window coating layer may be formed by coating the window coating layer composition onto the other side of the base layer, followed by curing. The back coating layer may be formed by coating the back coating layer composition on the one surface of the base layer, followed by curing. The back coating layer composition, the window coating layer composition, and the base layer are the same as described above.

Each of the window coating layer composition and the back coating layer composition may be coated onto the base layer by bar coating, spin coating, dip coating, roll coating, flow coating, or die coating, without being limited thereto. Curing may be performed by at least one of photo-curing and thermal curing. Photo-curing may be performed through UV irradiation at a fluence of 10 mJ/cm² to 1,000 mJ/cm² at a wavelength of about 400 nm or less. Thermal curing may be performed at 40° C. to 200° C. for 1 to 30 hours. Under these conditions, each of the window coating layer composition and the back coating layer composition can be sufficiently cured. For example, thermal curing may be performed after photo-curing in order to achieve higher hardness of each of the coating layers. Before curing the window coating layer composition and the back coating layer composition having been coated on the base layer, the window coating layer composition and the back coating layer composition may be subjected to drying. In this way, it is possible to prevent increase in surface roughness of each of the coating layers due to long-term photo-curing or thermal curing. Drying may be performed at 40° C. to 200° C. for 1 minute to 30 hours, without being limited thereto.

Next, a flexible display according to one embodiment of the present invention will be described with reference to FIG. 3 and FIG. 4. FIG. 3 is a sectional view of a flexible display according to one embodiment of the present invention and FIG. 4 is a sectional view of one embodiment of a display part shown in FIG. 3.

Referring to FIG. 3, a flexible display 300 according to one embodiment of the invention includes a display part 350a, an adhesive layer 360, a polarizing plate 370, a touchscreen panel 380, and a flexible window film 390, wherein the flexible window film 390 may include the window film according to the embodiments of the invention.

The display part 350a serves to drive the flexible display 300 and may include a substrate and an optical device formed on the substrate and including an OLED, an LED or an LCD device. FIG. 4 is a sectional view of one embodiment of the display part shown in FIG. 3. Referring to FIG. 4, the display part 350a may include a lower substrate 310, a thin film transistor 316, an organic light emitting diode 315, a flattening layerb 314, a protective layer 318, and an insulating layer 317.

The lower substratb 310 supports the display part 350a, and the thin film transistor 316 and the organic light emitting diode 315 may be formed on the lower substrate 310. The lower substrate 310 may be formed with a flexible printed circuit board (FPCB) for driving the touchscreen panel 380. The flexible printed circuit board may further include a timing controller, a power source, and the like in order to drive an array of organic light emitting diodes.

The lower substrate 310 may include a substrate formed of a flexible resin. Specifically, the lower substrate 310 may include a flexible substrate such as a silicon substrate, a polyimide substrate, a polycarbonate substrate, and a polyacrylate substrate, without being limited thereto.

In a display region of the lower substrate 310, plural pixel domains are defined by plural driving wires (not shown) and plural sensor wires (not shown) intersecting one another, and an array of organic light emitting diodes each including the thin film transistor 316 and the organic light emitting diode 315 connected to the thin film transistor 316 may be formed in each of the pixel domains. In a non-display region of the lower substrate, a gate driver may take the form of a gate-in-panel to apply electrical signals to the driving wires. A gate-in-panel circuit may be formed at one or both sides of the display region.

The thin film transistor 316 controls electric current flowing through a semiconductor by application of an electric field perpendicular thereto and may be formed on the lower substrate 310. The thin film transistor 316 may include a gate electrode 310a, a gate insulation layer 311, a semiconductor layer 312, a source electrode 313a, and a drain electrode 313b. The thin film transistor 316 may be an oxide thin film transistor using an oxide, such as indium gallium zinc oxide (IGZO), ZnO, or TiO, as the semiconductor layer 312, an organic thin film transistor using an organic material as the semiconductor layer, an amorphous silicon thin film transistor using amorphous silicon as the semiconductor layer, or a polycrystalline silicon thin film transistor using polycrystalline silicon as the semiconductor layer.

The flattening layer 314 covers the thin film transistor 316 and the circuit 310b to flatten upper surfaces of the thin film transistor 316 and the circuit 310b such that the organic light emitting diode 315 can be formed thereon. The flattening layer 314 may be formed of a spin-on-glass (SOG) film, a polyimide polymer, or a polyacrylic polymer, without being limited thereto.

The organic light emitting diode 315 realizes a display through self-emission and may include a first electrode 315a, an organic light-emitting layer 315b, and a second electrode 315c, which are stacked in the stated order. Adjacent organic light emitting diodes may be isolated from one another by the insulating layer 317. The organic light emitting diode 315 may have a bottom emission structure in which light from the organic light emitting layer 315b is discharged through the lower substrate or may have a top emission structure in which light from the organic light emitting layer 315b is discharged through the upper substrate.

The protective film 318 covers the organic light emitting diodes 315 to protect the organic light emitting diodes 315. The protective film 318 may be formed of an inorganic material such as $SiO_x$, $SiN_x$, SiC, SiON, SiONC, and amorphous carbon (a-C), or an organic material such as (meth) acrylates, epoxy polymers, and imide polymers. Specifically, the protective layer 318 may include an encapsulation layer in which an inorganic material layer and an organic material layer are sequentially stacked once or plural times.

Referring again to FIG. 3, the adhesive layer 360 attaches the display part 350a to the polarizing plate 370 and may be formed of an adhesive composition including a (meth) acrylate resin, a curing agent, an initiator, and a silane coupling agent.

The polarizing plate 30 can realize polarization of internal light or prevent reflection of external light to realize a display, or can increase contrast of the display. The polarizing plate may be composed of a polarizer alone. Alternatively, the polarizing plate may include a polarizer and a protective film formed on one or both surfaces of the polarizer. Alternatively, the polarizing plate may include a polarizer and a protective coating layer formed on one or both surfaces of the polarizer. As the polarizer, the protective film, and the protective coating layer, a typical polarizer, a typical protective film and a typical protective coating layer known in the art may be used.

The touchscreen panel 380 generates electrical signals through detection of variation in capacitance when a human body or a conductor such as a stylus touches the touchscreen panel, and the display part 350a may be driven by such electrical signals. The touchscreen panel 380 is formed by patterning a flexible conductor and may include first sensor electrodes and second sensor electrodes each formed between the first sensor electrodes and intersecting the first sensor electrodes. The touchscreen panel 380 may include a conductive material such as metal nanowires, conductive polymers, and carbon nanotubes, without being limited thereto.

The window film 390 may be disposed at the outermost side of the flexible display 300 to protect the flexible display.

Although not shown in FIG. 3, adhesive layers may further be formed between the polarizing plate 370 and the touchscreen panel 380 and/or between the touchscreen panel 380 and the flexible window film 390 to reinforce coupling between the polarizing plate, the touchscreen panel, and the window film. The adhesive layers may be formed of an adhesive composition including a (meth)acrylate resin, a curing agent, an initiator, and a silane coupling agent. Although not shown in FIG. 3, a polarizing plate may be further disposed under the display part 350a to realize polarization of internal light.

Next, a flexible display according to another embodiment of the present invention will be described with reference to FIG. 5. FIG. 5 is a sectional view of a flexible display according to another embodiment of the present invention.

Referring to FIG. 5, a flexible display 400 according to this embodiment includes a display part 350a, a touchscreen panel 380, a polarizing plate 370, and a flexible window film 390, wherein the window film 390 may include the window film according to the embodiments of the invention. The flexible display 400 is substantially the same as the flexible display according to the above embodiment except that the touchscreen panel 380 is directly formed on the display part 350a. In addition, the touchscreen panel 380 may be formed together with the display part 350a. In this case, since the touchscreen panel 380 is formed together with the display part 350a on the display part 350a, the flexible display according to this embodiment is thinner and brighter than the flexible display according to the above embodiment, thereby providing better visibility. Furthermore, the touchscreen panel 380 may be formed by deposition, without being limited thereto.

Although not shown in FIG. 5, adhesive layers may be further formed between the display part 350a and the touchscreen panel 380, between the touchscreen panel 380 and the polarizing plate 370 and/or between the polarizing plate 370 and the window film 390 to reinforce mechanical strength of the display. The adhesive layers may be formed of an adhesive composition including a (meth)acrylate resin, a curing agent, an initiator, and a silane coupling agent. In addition, although not shown in FIG. 5, a polarizing plate may be further disposed under the display part 350a to provide a good display image through polarization of internal light.

Next, a flexible display according to a further embodiment of the present invention will be described with reference to FIG. 6. FIG. 6 is a sectional view of a flexible display according to a further embodiment of the present invention.

Referring to FIG. 6, a flexible display 500 according to this embodiment includes a display part 350b, an adhesive layer 360, and a flexible window film 390, wherein the window film 390 may include the window film according to the embodiments of the invention. The flexible display 500 is substantially the same as the flexible display according to the above embodiment except that the flexible display 500 can be driven using the display part 350b alone and does not include a polarizing plate and a touchscreen panel.

The display part 350b may include a substrate and an optical device formed on the substrate and including an OLED, an LED or an LCD device. The display part 350b may further include a touchscreen panel therein.

Although the window films according to the embodiments are illustrated as being applied to a flexible display, it should be understood that the flexible window films according to the embodiments may also be applied to a non-flexible display.

Next, the present invention will be described in more detail with reference to some examples. It should be understood that these examples are provided for illustration only and are not to be construed in any way as limiting the present invention.

PREPARATIVE EXAMPLE 1: BACK COATING LAYER COMPOSITION

A fluorine-free acrylic oligomer (UP118, ENTIS Co., Ltd., hexa-functional acrylic oligomer) was mixed with a fluorine-free acrylic monomer (SR9020, SARTOMER Inc., tri-functional acrylic monomer), a solution containing inorganic hollow particles and a fluorine-containing acrylic monomer (XJA-0247, PELNOX Corporation, content of the inorganic hollow particles and the fluorine-containing acrylic monomer: 10 wt %), an initiator (Irgacure 184, BASF), and a dye (SK-D593, SK Chemicals) such that the fluorine-free acrylic oligomer, the fluorine-free acrylic monomer, the entirety of the inorganic hollow particles and the fluorine-containing acrylic monomer, the initiator, and the dye were present in amounts shown in Table 1, respectively, and then a blended solvent of isopropyl alcohol (IPA) and ethylene glycol dimethyl ether (EGDE) (weight ratio of IPA to EGDE: 7:3) was added to the mixture, followed by stirring for 30 minutes, thereby preparing a back coating layer composition.

PREPARATIVE EXAMPLES 2 TO 16: BACK COATING LAYER COMPOSITION

Back coating layer compositions were prepared in the same manner as in Preparative Example 1 except that the fluorine-free acrylic oligomer (UP118), the fluorine-free acrylic monomer (SR9020), the solution containing the inorganic hollow particles and the fluorine-containing acrylic monomer (XJA-0247), the initiator (Irgacure 184), and the dye (SK-D593) were used such that the contents of the fluorine-free acrylic oligomer, the fluorine-free acrylic monomer, the entirety of the inorganic hollow particles and the fluorine-containing acrylic monomer, the initiator, and the dye were changed as listed in Table 1.

PREPARATIVE EXAMPLE 17: WINDOW COATING LAYER COMPOSITION 50 g of 2-(3,4-epoxycyclohexyl)ethyltrimethoxysilane (KBM-303, Shin-Etsu Chemical) was placed into a 200 ml 3-neck flask. Then, based on the amount of 2-(3,4-epoxycyclohexyl)ethyltrimethoxysilane, 0.5 mol % of KOH and 1.5 mol % of water were added, followed by stirring at 25° C. for 1 hour and stirring at 70° C. for 2 hours. Then, the remaining solvent was removed from the resulting product using a vacuum distiller, thereby preparing a siloxane resin, which, in turn, was adjusted to 90 wt % in terms of solid content. The siloxane resin had a weight average molecular weight of 5,000 g/mol, as measured by gel permeation chromatography (GPC). 100 g of the prepared siloxane resin was mixed with 15 g of 3,4-epoxycyclohexylmethyl 3',4'-epoxycyclohexanecarboxylate as a curable monomer (CY-179, CIBA Co., Ltd.), 2 g of diphenyl iodonium hexafluorophosphate as an initiator (Sigma Aldrich Co., Ltd.), and 60 g of methyl ethyl ketone, thereby preparing a window coating layer composition.

TABLE 1

|  | ① | ② | ③ | ④ | ⑤ | Solvent |
|---|---|---|---|---|---|---|
| Preparative Example 1 | 65.2 | 21.7 | 9.7 | 2.9 | 0.5 | IPA:EGDE = 70:30 |
| Preparative Example 2 | 58.0 | 19.3 | 19.3 | 2.9 | 0.5 | IPA:EGDE = 70:30 |
| Preparative Example 3 | 50.7 | 16.9 | 29.0 | 2.9 | 0.5 | IPA:EGDE = 70:30 |
| Preparative Example 4 | 43.5 | 14.5 | 38.6 | 2.9 | 0.5 | IPA:EGDE = 70:30 |
| Preparative Example 5 | 36.2 | 12.1 | 48.3 | 2.9 | 0.5 | IPA:EGDE = 70:30 |
| Preparative Example 6 | 29.0 | 9.6 | 58.0 | 2.9 | 0.5 | IPA:EGDE = 70:30 |
| Preparative Example 7 | 21.8 | 7.2 | 67.6 | 2.9 | 0.5 | IPA:EGDE = 70:30 |
| Preparative Example 8 | 14.5 | 4.8 | 77.3 | 2.9 | 0.5 | IPA:EGDE = 70:30 |
| Preparative Example 9 | 43.5 | 14.5 | 38.6 | 2.9 | 0.5 | IPA:EGDE = 80:20 |
| Preparative Example 10 | 43.5 | 14.5 | 38.6 | 2.9 | 0.5 | IPA:EGDE = 60:40 |
| Preparative Example 11 | 43.5 | 14.5 | 38.6 | 2.9 | 0.5 | IPA:EGDE = 50:50 |
| Preparative Example 12 | 43.5 | 14.5 | 38.6 | 2.9 | 0.5 | IPA = 100 |
| Preparative Example 13 | 43.5 | 14.5 | 38.6 | 2.9 | 0.5 | EtOH = 100 |
| Preparative Example 14 | 43.5 | 14.5 | 38.6 | 2.9 | 0.5 | EtOH:Acetone = 90:10 |
| Preparative Example 15 | 72.5 | 24.1 | 0 | 2.9 | 0.5 | IPA:EGDE = 70:30 |
| Preparative Example 16 | 72.5 | 24.1 | 0 | 2.9 | 0.5 | MIBK:ACN = 20:80 |

①: Fluorine-free acrylic oligomer
②: Fluorine-free acrylic monomer
③: Inorganic hollow particles and fluorine-containing acrylic monomer
④: Initiator
⑤: Dye
IPA: Isopropyl alcohol
EGDE: Ethylene glycol dimethyl ether
EtOH: Ethanol
Acetone
MIBK: Methyl isobutyl ketone
ACN: Acetonitrile

EXAMPLE 1

The back coating layer composition prepared in Preparative Example 1 was coated onto one surface of a transparent polyimide film (thickness: 75 μm, yellow index: 3.2) using a bar coating applicator, followed by drying in an oven at 80° C. for 3 minutes and UV irradiation at a fluence of 300 mJ/cm$^2$ under nitrogen atmosphere, thereby forming a back coating layer (thickness: 100 μm) on the transparent polyimide film.

The window coating layer composition prepared in Preparative Example 17 was coated onto the other surface of the transparent polyimide film using a bar coating applicator. Then, the coated composition was dried in an oven at 80° C. for 3 minutes, exposed to UV light at a fluence of 500 mJ/cm$^2$ under nitrogen atmosphere, and subjected to post-curing at 120° C. for 24 hours, thereby preparing a window film in which the window coating layer (thickness: 50 μm), the transparent polyimide film (thickness: 75 μm), and the back coating layer (thickness: 100 nm) were formed in the stated order.

EXAMPLES 2 to 14

Window films were prepared in the same manner as in Example 1 except that the back coating layer compositions listed in Table 2 were used instead of the back coating layer composition of Preparative Example 1.

COMPARATIVE EXAMPLES 1 to 2

Window films were prepared in the same manner as in Example 1 except that the back coating layer compositions listed in Table 2 were used instead of the back coating layer composition of Preparative Example 1.

Each of the window films prepared in Examples and Comparative Examples was evaluated as to properties shown in Table 2.

(1) Index of refraction: In measurement of index of refraction of the base layer at a wavelength of 550 nm, measurement was performed on the base layer of each of the window films prepared in Examples and Comparative Examples at a wavelength of 400 nm to 800 nm using an ellipsometer (J. A. Woollam). In measurement of index of refraction of the window coating layer at a wavelength of 550 nm, measurement was performed on the window coating layer of each of the window films prepared in Examples and Comparative Examples, with the back coating layer removed therefrom using sandpaper, at a wavelength of 400 nm to 800 nm using an ellipsometer (J. A. Woollam). In measurement of index of refraction of the back coating layer at a wavelength of 550 nm, measurement was performed on the back coating layer of each of the window films prepared in Examples and Comparative Examples, with the window coating layer removed therefrom using sandpaper, at a wavelength of 400 nm to 800 nm using an ellipsometer (J. A. Woollam).

(2) Total light transmittance and haze: Total light transmittance and haze were measured on each of the window films prepared in Examples and Comparative Examples at a wavelength of 400 nm to 800 nm using a haze meter (NDH2000, NIPPON DENSHOKU).

(3) Reflectance: Reflectance was measured on each of the window films prepared in Examples and Comparative Examples in accordance with ASTM E1164 and standard of JIS Z 8722. Specifically, measurement was performed at a wavelength of 400 nm to 800 nm using a spectrophotometer (CM-3600A, KONICA MINOLTA).

(4) Pencil hardness: First, each of the window films prepared in Examples and Comparative Examples was cut into a specimen having a size of 50 mm×50 mm (width×length), and then pencil hardness was measured on the window coating layer of the specimen using a pencil hardness tester (Heidon-14EW, SHINTO SCIENTIPIC Co., Ltd.) in accordance with JIS K5400. Here, pencils of 6B to 9H (Mitsubishi Co., Ltd.) were used. Specifically, the measurement was performed under the following conditions: a scratch speed of 60 mm/min, a force of 19.6N, a scratch angle of 45°, a load of 1 kg, and a scale of 10.0 mm. When the coating layer had one or more scratches after being tested 5 times using a certain pencil, pencil hardness was measured again using another pencil having one-level lower pencil hardness than the previous pencil. A pencil hardness value allowing no scratch to be observed all five times on the coating layer was taken as pencil hardness of the coating layer.

(5) Radius of curvature: First, each of the window films prepared in Examples and Comparative Examples was cut into a specimen having a size of 3 cm×15 cm (width×length), and then the specimen was wound around a jig for measurement of radius of curvature (mandrel bend tester, COVOTECH Co., Ltd), kept wound for 5 seconds, unwound, and then observed with the naked eye to determine whether the specimen had cracks. In measurement of radius of curvature in the compressive direction, the specimen was wound around the jig such that the window coating layer contacted the jig. In measurement of radius of curvature in the tensile direction, the specimen was wound around the jig such that the back coating layer or the base layer contacted the jig. The radius of curvature was determined by a minimum radius of a jig causing no cracks in the specimen, as measured while gradually decreasing the diameters of jigs from a jig having the maximum diameter.

(6) Yellow index: Yellow index was measured on each of the window films prepared in Examples and Comparative Examples in accordance with ASTM D1925. In measurement, a spectrophotometer (CM-3600A, KONICA MINOLTA) was used. Specifically, measurement was performed at wavelength intervals of 10 nm in the wavelength range of 360 nm to 740 nm and the measurement diameter of a sample was 25.4 mm. In addition, as a light source, a D65 lamp was used, and light from the lamp traveled from the back coating layer to the window coating layer.

TABLE 2

| | Back coating layer | $A^1$ | $A^2$ | $A^3$ | Total light transmittance (%) | Haze (%) | Reflectance (%) | Pencil hardness | Radius of curvature (mm) | Yellowness |
|---|---|---|---|---|---|---|---|---|---|---|
| Example 1 | Preparative Example 1 | 1.52 | 1.53 | 1.73 | 91.57 | 0.82 | 6.51 | 3 H | 1.13 | 1.15 |
| Example 2 | Preparative Example 2 | 1.51 | 1.53 | 1.73 | 91.58 | 0.81 | 6.25 | 3 H | 1.18 | 0.71 |
| Example 3 | Preparative Example 3 | 1.45 | 1.53 | 1.73 | 92.84 | 0.81 | 5.53 | 3 H | 1.18 | 0.55 |
| Example 4 | Preparative Example 4 | 1.40 | 1.53 | 1.73 | 93.28 | 0.87 | 5.27 | 3 H | 1.14 | 0.77 |
| Example 5 | Preparative Example 5 | 1.43 | 1.53 | 1.73 | 93.01 | 0.85 | 5.17 | 3 H | 1.16 | 0.94 |

TABLE 2-continued

| | Back coating layer | $A^1$ | $A^2$ | $A^3$ | Total light transmittance (%) | Haze (%) | Reflectance (%) | Pencil hardness | Radius of curvature (mm) | Yellowness |
|---|---|---|---|---|---|---|---|---|---|---|
| Example 6 | Preparative Example 6 | 1.41 | 1.53 | 1.73 | 93.20 | 0.83 | 5.39 | 3 H | 1.19 | 1.03 |
| Example 7 | Preparative Example 7 | 1.41 | 1.53 | 1.73 | 93.44 | 0.85 | 4.83 | 3 H | 1.17 | 1.12 |
| Example 8 | Preparative Example 8 | 1.39 | 1.53 | 1.73 | 93.66 | 0.87 | 4.92 | 3 H | 1.15 | 1.15 |
| Example 9 | Preparative Example 9 | 1.41 | 1.53 | 1.73 | 93.14 | 0.95 | 5.13 | 3 H | 1.14 | 1.15 |
| Example 10 | Preparative Example 10 | 1.40 | 1.53 | 1.73 | 93.13 | 0.82 | 5.32 | 3 H | 1.12 | 0.67 |
| Example 11 | Preparative Example 11 | 1.40 | 1.53 | 1.73 | 93.43 | 0.83 | 4.67 | 3 H | 1.13 | 0.45 |
| Example 12 | Preparative Example 12 | 1.48 | 1.53 | 1.73 | 91.63 | 0.77 | 7.04 | 3 H | 1.13 | 2.24 |
| Example 13 | Preparative Example 13 | 1.46 | 1.53 | 1.73 | 92.39 | 0.83 | 6.27 | 3 H | 1.14 | 2.03 |
| Example 14 | Preparative Example 14 | 1.43 | 1.53 | 1.73 | 92.34 | 0.91 | 5.43 | 3 H | 1.16 | 1.90 |
| Comp. Example 1 | Preparative Example 15 | 1.58 | 1.53 | 1.73 | 88.44 | 0.84 | 8.42 | 3 H | 1.16 | 1.31 |
| Comp. Example 2 | Preparative Example 16 | 1.58 | 1.53 | 1.73 | 88.44 | 0.85 | 8.42 | 3 H | 1.18 | 1.31 |

*$A^1$: Index of refraction of back coating layer, $A^2$: Index of refraction of window coating layer, $A^3$: Index of refraction of base layer From the results shown in Table 2, it can be seen that the window films of Examples according to the present invention had high total light transmittance, low haze, low reflectance, and low yellowness.

Conversely, the window films of Comparative Examples 1 and 2, which were free from the inorganic hollow particles and the fluorine-containing monomer, had lower total light transmittance and higher reflectance than those of Examples.

It should be understood that various modifications, changes, alterations, and equivalent embodiments can be made by those skilled in the art without departing from the spirit and scope of the present invention.

The invention claimed is:

1. A window film comprising:
a base layer; a window coating layer directly formed on one surface of the base layer; and a back coating layer directly formed on the other surface of the base layer, wherein the window film satisfies Equation 1:

$$A^1 < A^2 < A^3 \qquad \text{<Equation 1>}$$

(where $A^1$ is an index of refraction of the back coating layer, $A^2$ is an index of refraction of the window coating layer, and $A^3$ is an index of refraction of the base layer).

2. The window film according to claim 1, wherein the back coating layer has an index of refraction of 1.54 or less, the window coating layer has an index of refraction of less than 1.60, and the base layer has an index of refraction of 1.60 or more.

3. The window film according to claim 1, wherein the base layer comprises a polyimide film.

4. The window film according to claim 1, wherein the window coating layer is formed of a window coating layer composition comprising a silicone resin.

5. The window film according to claim 1, wherein the back coating layer comprises inorganic hollow particles, at least one of a fluorine-containing monomer or an oligomer thereof, and a dye.

6. The window film according to claim 5, wherein the inorganic hollow particles comprise hollow silica.

7. The window film according to claim 1, wherein the back coating layer is formed of a back coating layer composition comprising: inorganic hollow particles; at least one of a fluorine-containing monomer or an oligomer thereof; at least one of a fluorine-free monomer or an oligomer thereof; an initiator; and a dye.

8. The window film according to claim 7, wherein the back coating layer composition comprises 9 wt % to 80 wt % of the inorganic hollow particles and the fluorine-containing monomer or the oligomer thereof, 15 wt % to 88 wt % of the fluorine-free monomer or the oligomer thereof, 1 wt % to 5 wt % of the initiator, and 0.001 wt % to 15 wt % of the dye, in terms of solid content.

9. The window film according to claim 7, wherein the back coating layer composition further comprises a solvent, the solvent being a blended solvent of isopropyl alcohol and ethylene glycol dimethyl ether.

10. The window film according to claim 9, wherein the blended solvent comprises isopropyl alcohol and ethylene glycol dimethyl ether in a weight ratio of 80:20 to 50:50 based on 100 parts by weight of isopropyl alcohol and ethylene glycol dimethyl ether.

11. The window film according to claim 1, wherein the window film has a total light transmittance of 90% or more and a reflectance of 8% or less.

12. The window film according to claim 1, wherein the base layer is a polyimide film and the window film has a yellow index of 2.3 or less.

13. The window film according to claim 1, wherein the base layer has a thickness of 10 μm to 150 μm, the window coating layer has a thickness of 5 μm to 100 μm, and the back coating layer has a thickness of 150 nm to 300 nm.

14. The window film according to claim 1, wherein the back coating layer comprises a dye.

15. The window film according to claim 1, wherein the back coating layer comprises at least one of a UV absorbent, a reaction inhibitor, an adhesion promoter, a thixotropic agent, a conductivity imparting agent, a color adjusting agent, a stabilizer, an antistatic agent, an antioxidant, and a leveling agent.

16. The window film according to claim 1, further comprising:
an adhesive layer formed on one surface of the back coating layer.

17. The window film according to claim 1, wherein the base layer comprises a film stack in which a first base layer, an adhesive layer, and a second base layer are sequentially stacked.

18. A method of preparing window films, comprising:
forming a back coating layer on one surface of a base layer using a back coating layer composition; and
forming a window coating layer on the other surface of the base layer using a window coating layer composition,
wherein the back coating layer composition comprises: inorganic hollow particles; at least one of a fluorine-containing monomer or an oligomer thereof; at least one of a fluorine-free monomer or an oligomer thereof; an initiator; a dye; and a solvent.

19. The method according to claim 18, wherein the inorganic hollow particles are hollow silica and the window coating layer composition comprises a silicone resin.

20. The method according to claim 18, wherein the solvent is a blended solvent comprising isopropyl alcohol and ethylene glycol dimethyl ether in a weight ratio of 80:20 to 50:50 based on 100 parts by weight of isopropyl alcohol and ethylene glycol dimethyl ether.

21. A flexible display comprising the window film according to claim 1.

* * * * *